United States Patent
Nagata

(10) Patent No.: US 9,252,084 B2
(45) Date of Patent: *Feb. 2, 2016

(54) SEMICONDUCTOR DEVICE AND METHOD OF MANUFACTURING SEMICONDUCTOR DEVICE

(71) Applicant: Sony Corporation, Tokyo (JP)

(72) Inventor: Masaya Nagata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/673,248

(22) Filed: Mar. 30, 2015

(65) Prior Publication Data

US 2015/0206826 A1 Jul. 23, 2015

Related U.S. Application Data

(63) Continuation of application No. 14/257,760, filed on Apr. 21, 2014, now Pat. No. 9,018,628, which is a continuation of application No. 13/468,457, filed on May 10, 2012, now abandoned.

(30) Foreign Application Priority Data

May 24, 2011 (JP) ................................. 2011-115633

(51) Int. Cl.
*H01L 23/58* (2006.01)
*H01L 21/66* (2006.01)
*H01L 23/48* (2006.01)

(52) U.S. Cl.
CPC .............. *H01L 23/481* (2013.01); *H01L 22/30* (2013.01)

(58) Field of Classification Search
CPC ........ H01L 22/30; H01L 22/32; H01L 23/481
USPC ............ 438/11–18; 257/48, E21.521–21.531
See application file for complete search history.

(56) References Cited

U.S. PATENT DOCUMENTS 9,018,628 B2 * 4/2015 Nagata ............................ 257/48

FOREIGN PATENT DOCUMENTS

| JP | 2004-296643 | 10/2004 |
| JP | 2006-128171 | 5/2006 |
| JP | 2007-194498 | 8/2007 |
| JP | 2008-109106 | 5/2008 |
| JP | 2012-151475 | 8/2012 |
| WO | WO 2011/058712 | 5/2011 |

OTHER PUBLICATIONS

Official Action (with English translation) for Japanese Patent Application No. 2011-115633 mailed Jan. 13, 2015, 10 pages.

* cited by examiner

*Primary Examiner* — Calvin Lee
(74) *Attorney, Agent, or Firm* — Sheridan Ross P.C.

(57) ABSTRACT

A semiconductor device including: a base material portion that includes a semiconductor substrate and an insulating film that is formed on one face of the semiconductor substrate and on which a vertical hole is formed along the thickness direction of the semiconductor substrate; a vertical hole wiring portion that includes a vertical hole electrode formed on a side wall of the base material portion that forms the vertical hole; a metallic film that is formed within the insulating film and that is electrically connected to the vertical hole wiring portion; and a conductive protective film that is formed to be in contact with the metallic film within the insulating film and that is formed in a region that includes a contact region of a probe during a probe test that is performed in the middle of manufacture on a film face of the metallic film.

10 Claims, 12 Drawing Sheets

PRIOR ART

SEMICONDUCTOR DEVICE AND METHOD OF MANUFACTURING SEMICONDUCTOR DEVICE

CROSS-REFERENCE TO RELATED APPLICATIONS

This application is a continuation of U.S. patent application Ser. No. 14/257,760, filed Apr. 21, 2014, now U.S. Pat. No. 9,018,628, issued Apr. 28, 2015, which is a continuation of U.S. patent application Ser. No. 13/468,457, filed May 10, 2012, which claims priority to Japanese Patent Application JP 2011-115633, filed in the Japan Patent Office on May 24, 2011, the entire disclosures of which are hereby incorporated herein by reference.

BACKGROUND

The present disclosure relates to a semiconductor device and a method of manufacturing the semiconductor device, and more precisely relates to a semiconductor device that conducts an electrical performance evaluation of a semiconductor member in the middle of the manufacture of the semiconductor device, and a method of manufacturing such a semiconductor device.

In the related art, in order to miniaturize and improve the functions of a semiconductor device, a semiconductor device is configured by laminating a plurality of semiconductor members (wiring substrates). With such a semiconductor device, a vertical hole-like wiring portion (hereinafter, also referred to as a TSV (Through Silicon Via)) that extends along the thickness direction of a silicon substrate is formed on the silicon substrate of each semiconductor member in order to obtain an electrical connection between each semiconductor member. Specifically, first, vertical holes that extend along the thickness direction of a silicon substrate is formed, and next, an electrode film composed of a metallic material such as, Cu is formed on surface of a wall portion of the silicon substrate in which the vertical hole is drawn.

With a semiconductor device that includes a TSV as described above, in general, an electrical performance evaluation (hereinafter, also referred to as a probe test) of the semiconductor members is performed in the middle of the manufacture thereof before the TSV is formed. In a probe test, an evaluation of the electrical performance of the semiconductor members is normally conducted by exposing a portion (pad portion) of the wiring and causing a probe to come into contact with the pad portion.

Therefore, when a probe test is performed, traces of the probe (hereinafter referred to as probe marks) remain on the pad portion of the wiring. In such a case, chemicals such as a plating solution, which are used in the formation process of the TSV (for example, a plating solution) after the probe test, may seep into the member from the probe marks and damage the pad portion. Further, since an opening portion for exposing the pad portion is provided, the pad portion does not obtain sufficient strength, and there may be a case when the pad portion is deformed or peeled during the formation process of the TSV. That is, due to the probe test, the yield, the reliability, and the like of the semiconductor device may decrease.

Therefore, in the related art, various techniques for decreasing the influence of the probe test described above have been proposed (for example, refer to Japanese Unexamined Patent Application Publication No. 2007-288150). Schematic cross-sectional diagrams of a wiring substrate that is proposed in Japanese Unexamined Patent Application Publication No. 2007-288150 is illustrated in FIGS. 23A and 23B.

Here, the example illustrated in FIG. 23A is a first configuration example of the wiring substrate and the example illustrated in FIG. 23B is a second configuration example of the wiring substrate.

In the first configuration example as illustrated in FIG. 23A, a wiring substrate 400 includes a base material 401 and a base substrate 410 that includes a first insulating portion 402 that is formed on one face of the base material 401. Furthermore, a through hole 403 that extends in the thickness direction is formed on the inside of the base substrate 410. Further, the wiring substrate includes a first conductive layer 411 that is formed on the inside of the first insulating portion 402 to block one opening portion of the through hole 403 and a second conductive layer 412 that is formed on the surface of the first insulating portion 402. Furthermore, the wiring substrate 400 includes an island-patterned intermediate layer 413 that connects the first conductive layer 411 and the second conductive layer 412.

Further, the wiring substrate 400 includes a second insulating portion 414 that is formed on the second conductive layer 412. Furthermore, an opening portion 414a that is the contact region of the probe is formed in the region of the second insulating portion 414 that is positioned directly over the through hole 403. As described above, with the first configuration example, the conductive portion of the opening portion 414a of the second insulating portion 414 that is the contact region of the probe has a multi-layered structure, and in so doing, the influence of the probe marks described above is reduced.

On the other hand, in the second configuration example, as illustrated in FIG. 23B, a wiring substrate 420 includes a base material 421 and a base substrate 430 that includes a first insulating portion 422 that is formed on one face of the base material 421. Furthermore, a through hole 423 that extends in the thickness direction is formed on the inside of the base substrate 430. Furthermore, the wiring substrate 420 includes a conductive portion 431 that is formed on a first insulating portion 422 in order to block one opening portion of the through hole 423 and a second insulating portion 432 that is formed on the surface of the conductive portion 431.

Furthermore, in the second configuration example, an opening portion 432a is formed in the region of the second insulating portion 432 that does not overlap the opening region of the through hole 423 within the plane of the wiring substrate 420. That is, in the second configuration example, the influence of the probe test described above is reduced by placing the region of the conductive portion 431 which is the contact region of the probe within the plane of the wiring substrate 420 at a region that does not overlap the opening region of the through hole 423.

SUMMARY

As described above, in the related art, with a semiconductor device that includes a TSV, various techniques have been proposed for reducing the influence on the product of a probe test that is performed in the middle of the manufacture thereof. However, with such a semiconductor device that includes a TSV, there is a demand for the development of a technique that further improves the yield, the reliability, and the like of the semiconductor device by further reducing the influence on the product of the probe test described above.

It is desirable to provide a semiconductor device that is able to further improve the yield, the reliability, and the like by further reducing the influence on the product of the probe test described above, and a method of manufacturing such a semiconductor device.

A semiconductor device according to an embodiment of the present disclosure has a configuration of including a base material portion, a vertical hole wiring portion, a metallic film, and a conductive protective film, and the configuration of each portion is as below. The base material portion includes a semiconductor substrate and an insulating film that is formed on one face of the semiconductor substrate, and a vertical hole is formed along the thickness direction of the semiconductor substrate on the inside. The vertical wiring portion includes a vertical hole electrode that is formed on a side wall of the substrate portion that forms the vertical hole. The metallic film is formed within the insulating film, and is electrically connected to the vertical hole wiring. The conductive protective film is formed to be in contact with the metallic film within the insulating film, and is formed in a region that includes the contact region with the probe during a probe test that is performed in the middle of manufacture on the film face of the metallic film.

Further, a method of manufacturing the semiconductor device according to another embodiment of the present disclosure is performed by the following procedure. First, a metallic film is formed within an insulating film of a base material portion that includes a semiconductor substrate and the insulating film which is formed on one face of the semiconductor substrate. Next, a conductive protective film is formed to be in contact with the metallic film in a predetermined region that is within the insulating film and that is within the film face of the metallic film. Further, a probe test is performed by causing the probe in contact with one of the metallic film and the conductive protective film which is exposed on a surface of the insulating film which is an opposite side to the semiconductor substrate side. After the probe test, a vertical hole is formed on the base material portion along a thickness direction of the semiconductor substrate.

As described above, with the semiconductor device and the method of manufacturing the semiconductor device of the embodiments of the present disclosure, a conductive protective film is formed to be in contact with a metallic film in a predetermined region that includes the contact region of the probe during the probe test. Therefore, according to the embodiments of the present disclosure, it is possible to further reduce the influence on the product of the probe test described above, and the yield, the reliability, and the like of the semiconductor device is able to be improved further.

DETAILED DESCRIPTION OF EMBODIMENTS

Examples of a semiconductor device and a method of manufacturing the semiconductor device according to the embodiments of the present disclosure will be described with reference to the drawings in the following order. However, the embodiments of the present disclosure are not limited to the examples below.

1. First Embodiment
2. Second Embodiment
3. Various Modifications and Applications <1. First Embodiment>

[Overall Configuration of Semiconductor Device]

Figure 1:
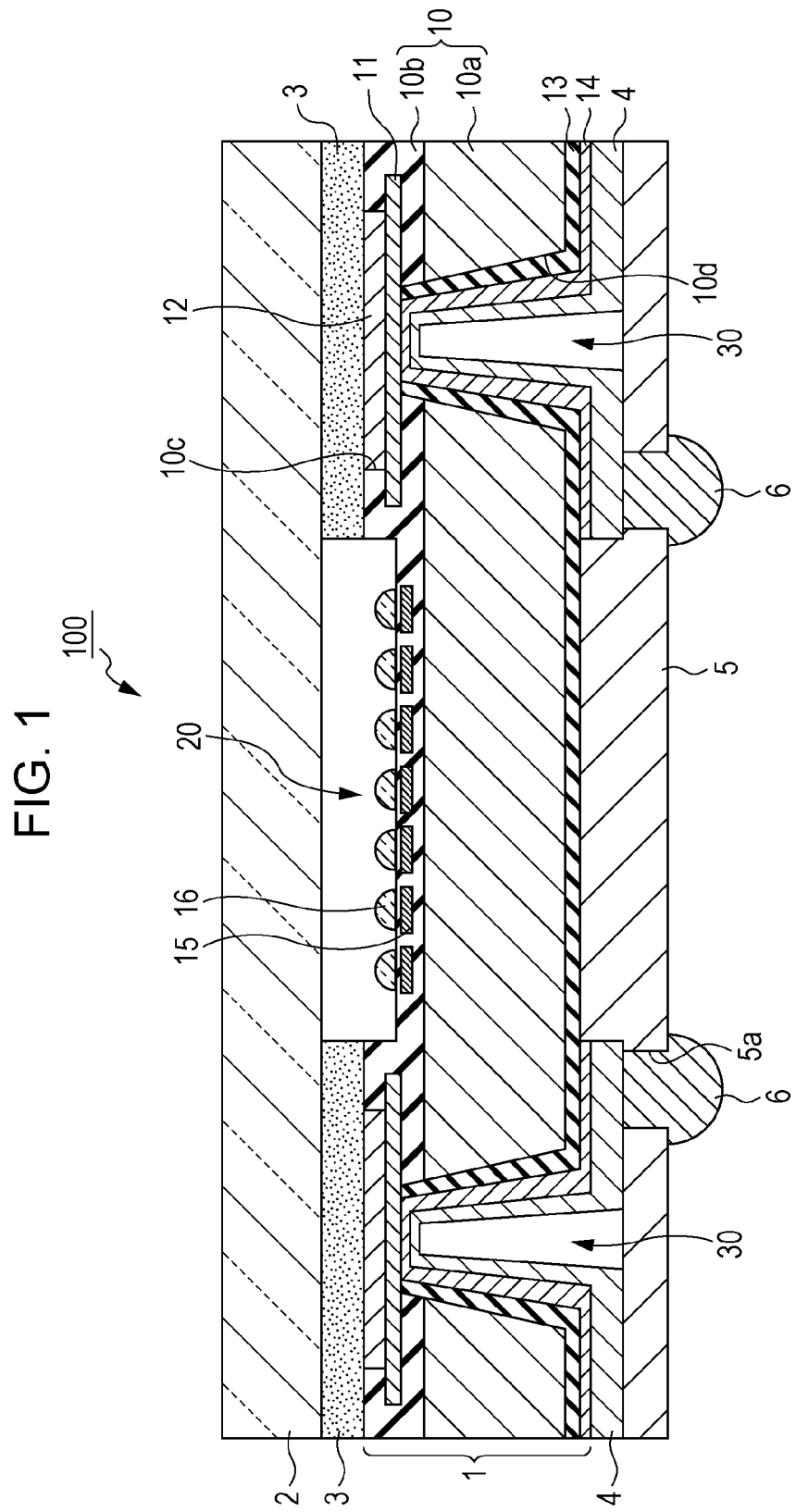
FIG. 1 is a schematic cross-sectional diagram of a semiconductor device according to a first embodiment of the present disclosure.

A schematic cross-sectional diagram of a semiconductor device according to a first embodiment is illustrated in FIG. 1. Here, according to the present embodiment, a solid-state imaging element (image sensor) will be described as an example. Further, in order to simplify description, only the configuration of a sensor unit and the vicinity of a TSV are illustrated in FIG. 1.

A semiconductor device 100 includes a device main body portion 1, a glass substrate 2, a glass sealing material 3, a plating film 4, a solder mask 5, and a solder ball 6. The configuration of the device main body portion 1 will be described in detail later.

The glass substrate 2 is provided via the glass sealing material 3 on one face (upper face in the example of FIG. 1) of the device main body portion 1. Here, the glass sealing material 3 is a sealing member for pasting together the device main body portion 1 and the glass substrate 2.

The plating film 4 is provided on a portion on the other face (lower face in the example of FIG. 1) of the device main body portion 1. Specifically, the plating film 4 is provided to cover a metal seed layer 14 that configures a TSV 30 (vertical wiring portion) described later of the device main body portion 1. Here, the plating film 4 is also used as a mask when patterning the metal seed layer 14 that configures the TSV 30 by etching.

The solder mask 5 is provided to cover the lower face of the device main body portion 1 and the plating film 4. Further, an opening portion 5a for exposing the plating film 4 is provided on the solder mask 5, and the solder ball 6 is provided on the opening portion 5a. In so doing, the solder ball 6 is electrically connected to the TSV 30 via the plating film 4. Here, the solder ball 6 is a connection terminal for outputting a signal that is output via the TSV 30 to an external wiring. Further, the solder mask 5 acts as a mask to prevent the solder from attaching to unnecessary portions when an external wiring is connected to the solder ball 6 by soldering.

[Configuration of Device Main Body Portion]

The device main body portion 1 includes an Si base material portion 10 (base material portion), a metal pad 11 (metallic film), a conductive protective film 12, an insulating layer 13, and a metal seed layer 14 (vertical hole electrode). Further, the device main body portion 1 includes a plurality of photodiodes 15 that convert light that is received from the outside into charge signals, and a plurality of on-chip micro lenses 16 that are respectively provided directly above the plurality of photodiodes 15 and that respectively collect light on the corresponding photodiodes 15.

The Si base material portion 10 includes an Si layer 10a (semiconductor substrate) that is configured, for example, by a silicon substrate or the like, and an oxidized layer 10b (insulating film) that is formed on one surface (upper face in the example of FIG. 1) of the Si Layer 10a. Here, the oxidized layer 10b is configured by an $SiO_2$ film, and an opening portion 10c that exposes the metal pad 11 is provided on the oxidized layer 10b. Further, a vertical hole 10d that extends along the thickness direction is formed on the inside of the Si base material portion 10. Here, the vertical hole 10d is formed to extend from the other surface (lower face in the example of FIG. 1) of the Si layer 10a to the lower face of the metal pad 11.

Further, with the present embodiment, the plurality of on-chip micro lenses 16 are provided by being arranged on the surface of the oxidized layer 10b of the Si base material portion 10, and the plurality of photodiodes 15 that correspond to the plurality of on-chip micro lenses 16 are respectively formed within the oxidized layer 10b. In so doing, a sensor unit 20 that detects light from the subject is configured. Here, although not shown in FIG. 1, the sensor unit 20 also includes, for example, a color filter, various transistors, a floating diffusion, or the like.

The metal pad 11 is provided within the oxidized layer 10b. At such a time, the metal pad 11 is provided to block the opening of the vertical hole 10d of the Si base material portion 10 on the glass substrate 2 side. Here, the metal pad 11 is able to be formed by a conductive material such as, for example, Al, Cu, W, Ni, or Ta. Further, the thickness of the metal pad 11 is able to be set to approximately equal to or less than 1 μm.

The metal pad 11 is used as a wiring for an output electrode for outputting the signals that are output from the sensor unit 20 to the outside, an input electrode for applying a voltage to the sensor unit 20, a ground electrode, or the like. More specifically, the metal pad 11 is used, for example, as a terminal portion (BEOL: Back End Of the Line) of a signal line that is connected to a selection transistor (not shown) that configures pixels (not shown) that are provided within the sensor unit 20.

The conductive protective film 12 is formed on the metal pad 11 (first region) that is exposed on the opening portion 10c of the oxidized layer 10b. Here, in the present embodiment, the conductive protective film 12 is provided on a region with which a probe comes into contact when a probe test is performed in the middle of the manufacture of a semiconductor device 100. That is, in the present embodiment, the conductive protective film 12 is used as a probe pad. Therefore, in the present embodiment, the conductive protective film 12 is configured by a thick metallic film in order to protect the metal pad 11 during the probe test. Here, while the thickness of the conductive protective film 12 is set as appropriate by taking into consideration conditions such as, for example, the contact pressure of the probe, it is preferable that the thickness be as thick as possible. For example, the thickness of the conductive protective film 12 is able to be set within a range of several μm to several tens of μm.

Further, an arbitrary material is able to be used as the formation material of the conductive protective film 12 as long as the formation material is a conductive material that is able to form a thick metallic film. For example, the conductive protective film 12 is able to be formed by a metallic material such as Ni, Cu, Au, or Ag. Here, while an example in which the conductive protective film 12 is configured by one metallic film is described in the present embodiment, the embodiments of the present disclosure are not limited thereto, and the configuration of the conductive protective film 12 may be a multi-layered structure in which a plurality of metallic films are laminated.

Further, in the present embodiment, the insulating layer 13 ($SiO_2$ layer) and the metal seed layer 14 are laminated in such an order on a side wall of the Si base material portion 10 that draws the vertical hole 10d of the Si base material portion 10. Here, at such a time, the insulating layer 13 and the metal seed layer 14 are formed so that the metal seed layer 14 and the lower face of the metal pad 11 are in direct contact. In the embodiment, in such a manner, the TSV 30 is configured by providing the insulating layer 13 and the metal seed layer 14 on a side wall of the Si base material portion 10 that draws the vertical hole 10d of the Si base material portion 10.

The TSV 30 outputs a signal that is output from the sensor unit 20 via the metal pad 11 to an external wiring via the metal seed layer 14, the plating film 4, and the solder ball 6. That is, with the semiconductor device 100 of the present embodiment, a signal that is detected by the sensor unit 20 is retrieved from the side of the solder mask 5 of the device main body portion 1.

[Technique of Manufacturing Semiconductor Device]

Next, an example of a technique of creating the semiconductor device 100 of the present embodiment will be described with reference to FIGS. 2 to 10. Here, FIGS. 2 to 10 are schematic cross-sectional diagrams of the semiconductor member that is created in each process. Further, here, in order to simplify description, the creation process of the configuration of the device main body portion 1 in the vicinity of the TSV 30 will be described. Other configuration portions are able to be created similarly to the creation technique of a solid-state imaging element of the related art, for example.

Figure 2:
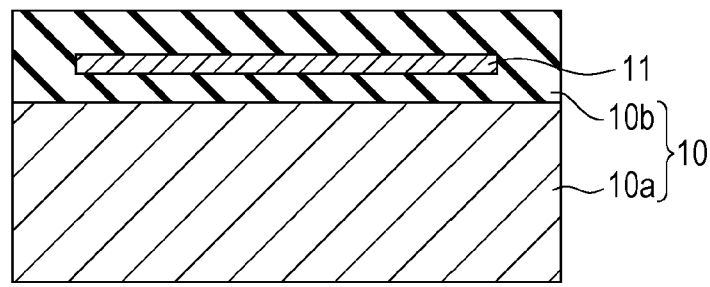
FIG. 2 is a diagram for illustrating the manufacturing process of the semiconductor according to the first embodiment.

First, in the present embodiment, as illustrated in FIG. 2, the metal pad 11 is formed within the oxidized layer 10b of the Si base material portion 10. Here, the metal pad 11 is able to be created similarly to the creation technique of a metal pad of a solid-state imaging element of the related art, for example.

For example, first, an oxidized film ($SiO_2$ film) is formed on the Si layer 10a using a technique such as, for example, a plasma CVD (Chemical Vapor Deposition) method. Next, a metallic film that is composed of the formation material of the metal pad 11 is formed on the oxidized film using a technique such as, for example, a sputtering method. The metal pad 11 is then formed by patterning the metallic film. Here, at such a time, the metal pad 11 with a slightly larger size that is characteristically important is formed by taking into consideration the process margin of the opening portion 10c described later of the oxidized layer 10b that is formed on the metal pad 11. Furthermore, the oxidized film is formed on the metal pad 11 using a technique such as, for example, a plasma CVD method. In the present embodiment, the metal pad 11 is able to be formed within the oxidized layer 10b in such a manner.

Figure 3:
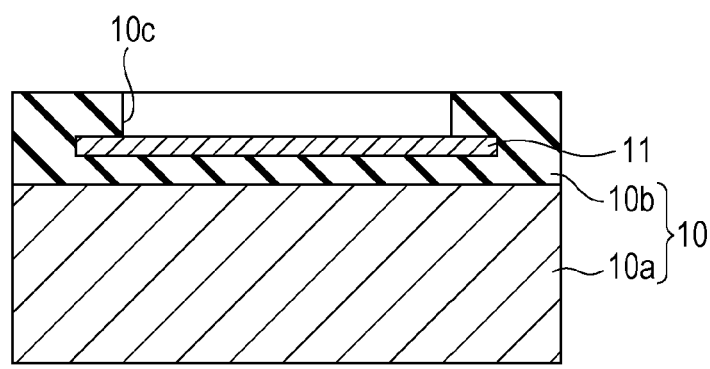
FIG. 3 is another diagram for illustrating the manufacturing process of the semiconductor according to the first embodiment.

Next, a portion of the region of the oxidized layer 10b on the metal pad 11, specifically, the formation region of the conductive protective film 12 (region that includes the contact region of the probe) is removed by etching. In so doing, as illustrated in FIG. 3, the opening portion 10c is formed on the formation region of the conductive protective film 12 of the oxidized layer 10b, and the metal pad 11 is exposed to the opening portion 10c. Here, in the present embodiment, as described above, the metal pad 11 with a slightly larger size than is characteristically important is formed taking the process margin of the opening portion 10c into consideration. Therefore, the opening area of the opening portion 10c becomes smaller than the area of the metal pad 11, and the region in the vicinity of the outer circumference end portion of the metal pad 11 becomes a state of being covered by the oxidized layer 10b.

Figure 4:
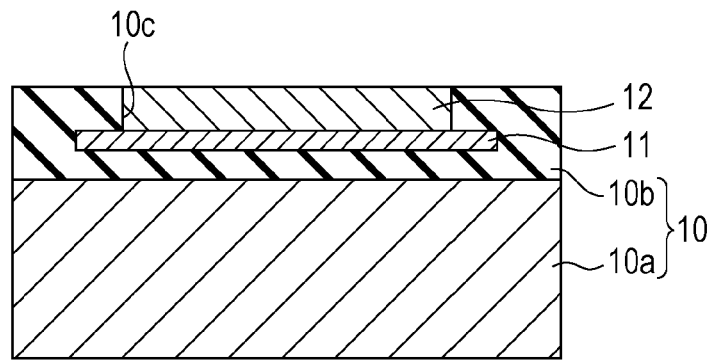
FIG. 4 is another diagram for illustrating the manufacturing process of the semiconductor according to the first embodiment.

Next, as illustrated in FIG. 4, the conductive protective film 12 is formed on the metal pad 11 that is exposed to the opening portion 10c of the oxidized layer 10b using a technique such as, for example, a non-electrolytic plating method, a screen printing method, a spray coating method, or a stud bump forming method. Here, at such a time, in the present embodiment, the conductive protective film 12 is formed so that the surface of the conductive protective film 12 and the surface of the oxidized layer 10b are together.

Described more specifically, in a case when a screen printing method is used as the formation technique of the conductive protective film 12, for example, first, a screen on which holes for filling with a conductive paste are arranged on the opening portion 10c. Next, the conductive paste is put on the screen. Next, the conductive paste is spread on the screen using a squeegee. In so doing, the conductive protective film 12 is formed by the conductive paste being filled into the opening portion 10c via the holes in the screen.

Further, in a case when a spray coating method is used as the formation technique of the conductive protective film 12, for example, the conductive paste is discharged from a nozzle onto the opening portion 10c at a miniscule rate. In so doing, the conductive protective film 12 is formed by the conductive pasts being filled into the opening portion 10c.

Figure 5:
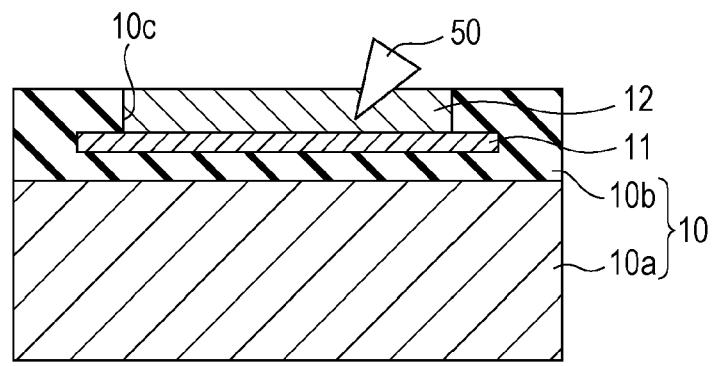
FIG. 5 is another diagram for illustrating the manufacturing process of the semiconductor according to the first embodiment.
Figure 6:
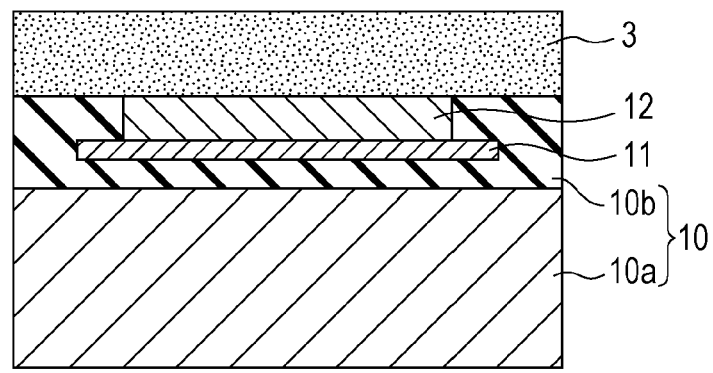
FIG. 6 is another diagram for illustrating the manufacturing process of the semiconductor according to the first embodiment.

Next, a probe test is performed on the semiconductor member on which the conductive protective film 12 is formed. Specifically, as illustrated in FIG. 5, the electrical performance of the semiconductor member is evaluated by causing a probe 50 to come into contact with the conductive protective film 12. Here, at such a time, although probe marks are generated on the conductive protective film 12, since the metal pad 11 that is formed on the lower portion thereof is protected by the conductive protective film 12, there is no damage to the metal pad 11.

Once the probe test described above ends, as illustrated in FIG. 6, the glass sealing material 3 is formed on the oxidized layer 10b of the Si base material portion 10 and the conductive protective film 12. Here, while not shown in FIG. 6, the glass sealing material 3 is also formed on the sensor unit 20 during such a process.

Figure 7:
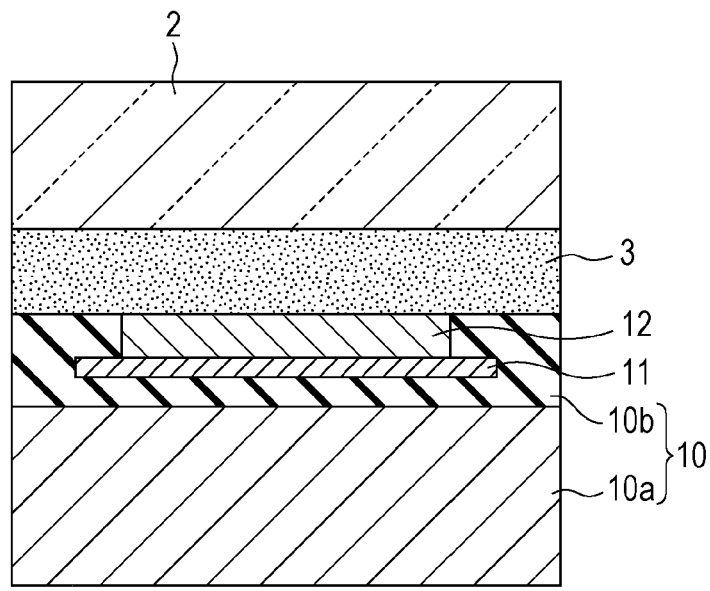
FIG. 7 is another diagram for illustrating the manufacturing process of the semiconductor according to the first embodiment.

Next, as illustrated in FIG. 7, the glass substrate 2 is placed on the glass sealing material 3, and the glass substrate 2 and the Si base material portion 10 are pasted together via the glass sealing material 3. Here, while not shown in FIG. 7, in the present embodiment, during such a process, the thickness of the Si base material portion 10 is thinned with the surface on the opposite side to the side of the Si layer 10a as the oxidized layer 10b (lower face in FIG. 7) as the back grind (BGR).

Figure 8:
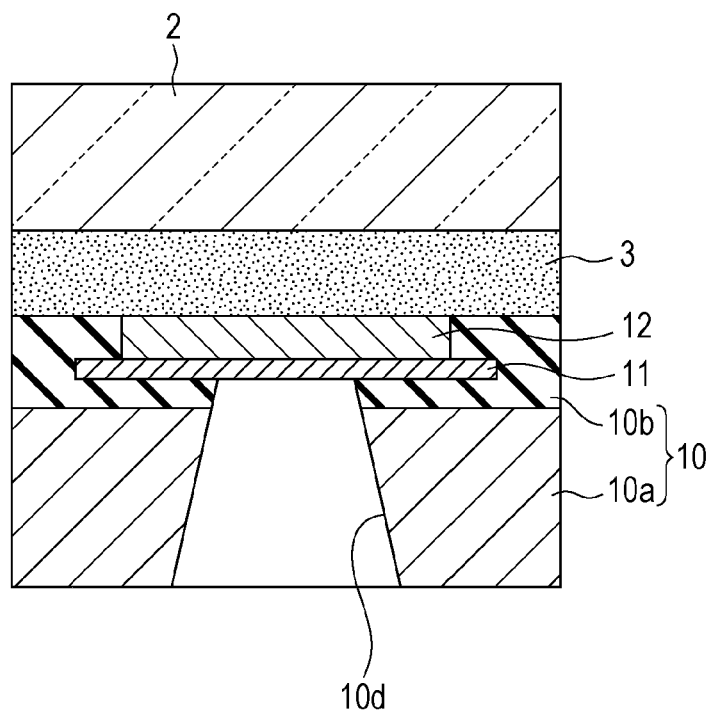
FIG. 8 is another diagram for illustrating the manufacturing process of the semiconductor according to the first embodiment.

Next, as illustrated in FIG. 8, the vertical hole 10d is formed on the lower portion (Si layer 10a side) of the metal pad 11 by etching a predetermined region of the lower face of the Si layer 10a by a dry etching method. At such a time, a portion of the lower face of the metal pad 11 is exposed to the opening portion of the vertical hole 10d by forming the vertical hole 10d that extends from the lower face of the Si layer 10a to the lower face of the metal pad 11. Here, since the ratio (selected ratio) of the etching rate of the oxidized layer 10b and the etching rate of the metal pad 11 is high, it is easy to stop the etching process on the lower face of the metal pad 11.

Figure 9:
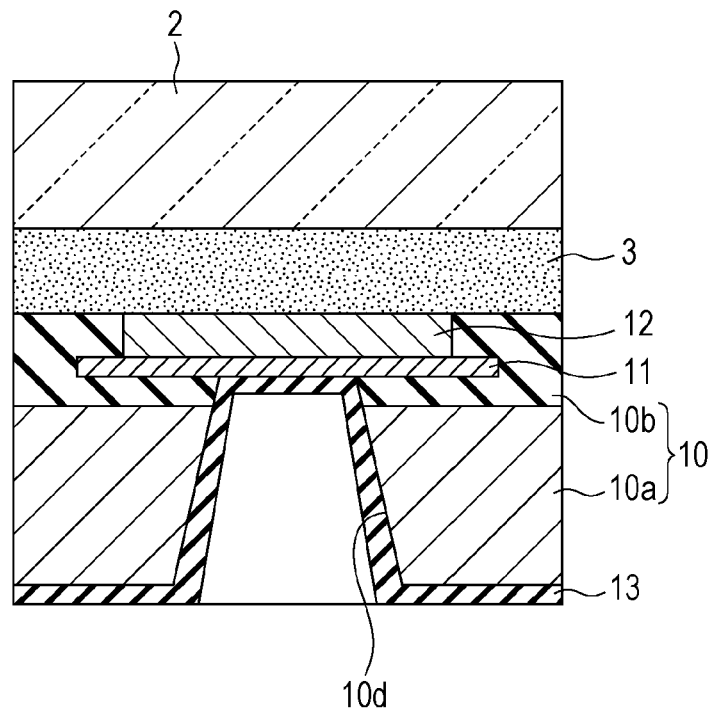
FIG. 9 is another diagram for illustrating the manufacturing process of the semiconductor according to the first embodiment.

Next, as illustrated in FIG. 9, the insulating layer 13 ($SiO_2$ layer) is formed on the lower face of the Si layer 10a, on the side wall of the Si base material portion 10 that draws the vertical hole 10d, and on the lower face of the metal pad 11 that is exposed to the vertical hole 10d by a technique such as, for example, a plasma CVD method.

Figure 10:
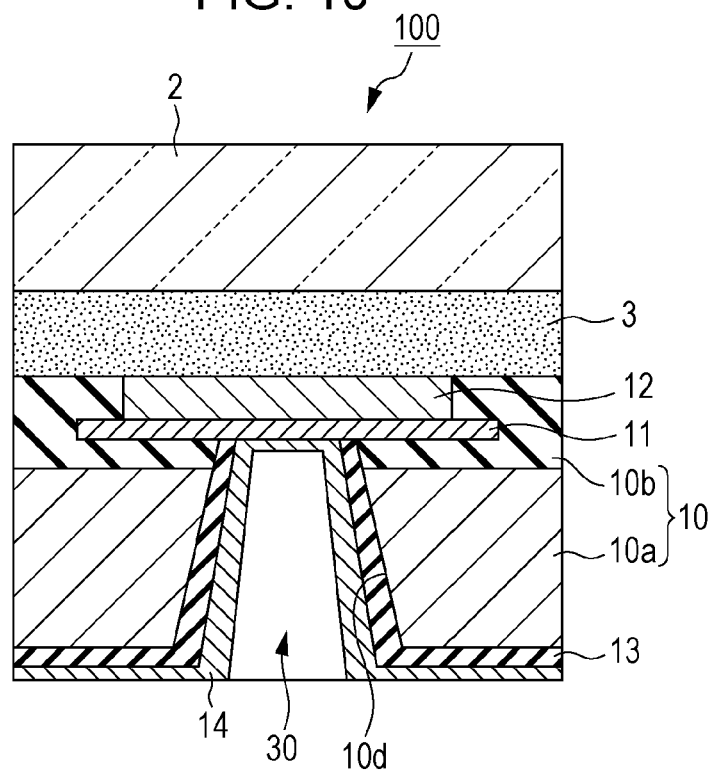
FIG. 10 is another diagram for illustrating the manufacturing process of the semiconductor according to the first embodiment.

Next, a portion of the metal pad 11 is exposed to the vertical hole 10d by removing a portion of the insulating layer 13 that is formed on the lower face of the metal pad 11. Thereafter, as illustrated in FIG. 10, the metal seed layer 14 is formed on the insulating layer 13 and the lower face of the exposed metal pad 11 by a technique such as, for example, a sputtering method. In so doing, the metal pad 11 and the metal seed layer 14 are electrically connected.

Thereafter, the plating film 4, the solder mask 5, and the solder ball 6 are formed similarly to the method of creating the solid-state imaging element of the related art. In the present embodiment, the semiconductor device 100 is created in such a manner.

As described above, with the technique of manufacturing the semiconductor device 100 of the present embodiment, a thick conductive protective film 12 is provided on the metal pad 11, and the conductive protective film 12 is used as a probe pad. Therefore, according to the present embodiment, damage on the metal pad 11 due to probe marks that are generated during the probe test is able to be reduced. That is, damage on the metal pad 11 by the penetration of chemicals (for example, a plating solution or the like) that are used in the formation process of the TSV 30 into the probe marks is able to be prevented.

Figure 23A:
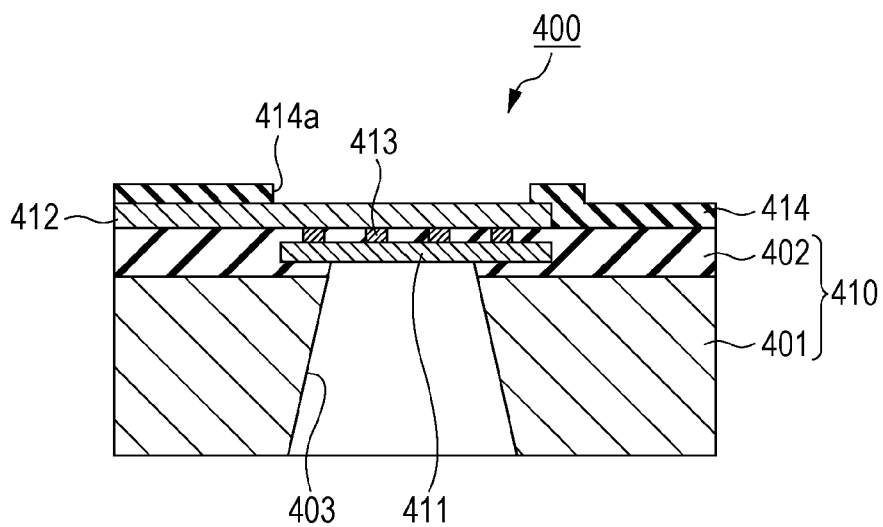
FIGS. 23A and 23B are schematic cross-sectional diagrams of a wiring substrate of the related art which includes a TSV.
Figure 23B:
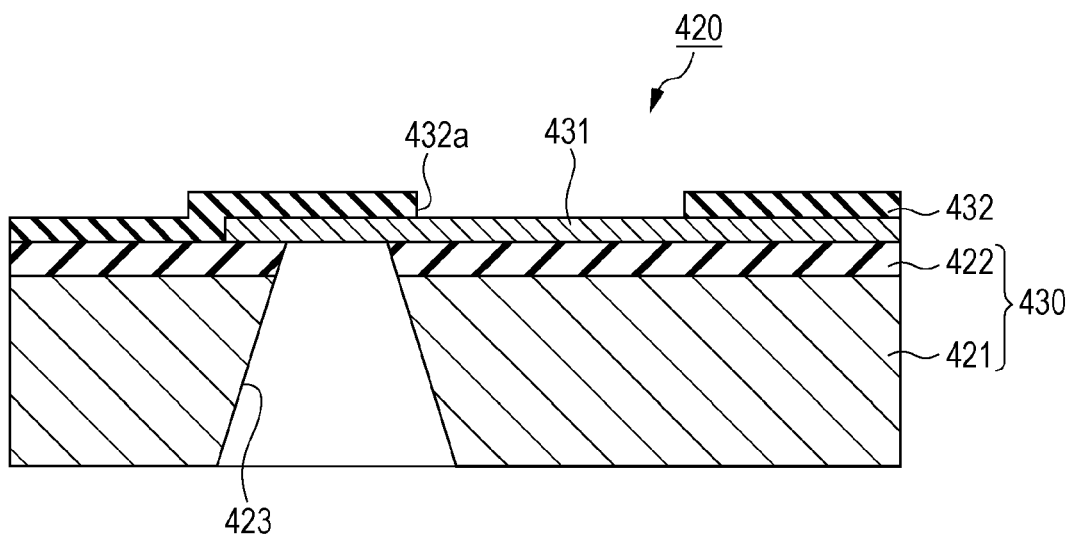

Furthermore, in the present embodiment, the following advantages are obtained over the technique that is proposed in Japanese Unexamined Patent Application Publication No. 2007-288150, which is described in FIGS. 23A and 23B, for example.

Since with the wiring substrate of the related art described in FIGS. 23A and 23B, an insulating film (oxidized film) is provided on the second conductive layer 412 with which the probe is brought into contact or a lower portion of the conductive portion 431, there is a possibility that damage is caused to the insulating film by the contact of the probe during the probe test. In such a manner, in a case when damage is caused on the insulating film, the yield, the reliability, and the like of the product are also decreased. On the other hand, since with the semiconductor device 100 of the present embodiment, since the conductive protective film 12 is provided directly on the metal pad 11, damage is not causes on the oxidized layer 10b of the Si base material portion 10 when the probe 50 is brought into contact with the conductive protective film 12.

Further, with the first configuration example that is proposed in Japanese Unexamined Patent Application Publication No. 2007-288150 (refer to FIG. 23A), the intermediate layer 413 with an island pattern is provided to be in contact with the first conductive layer 411 in a region of the first conductive layer 411 with which the probe is in contact. On the other hand, with the semiconductor device 100 of the present embodiment, the conductive protective film 12 is provided to be in contact with the metal pad 11 across the entire region that includes the contact region of the probe.

That is, the present embodiment has a configuration in which the metal pad 11 is lined by the conductive protective film 12 in a region that includes the contact region of the probe, and the contact area between the metal pad 11 and the conductive protective film 12 becomes greater than that of the first configuration example of Japanese Unexamined Patent Application Publication No. 2007-288150. Therefore, in the present embodiment, the strength of the metal pad 11 is able to be increased compared to the first configuration example of Japanese Unexamined Patent Application Publication No. 2007-288150 described above. In such a case, transformation or peeling of the metal pad 11 is able to be suppressed during the various processes (including the formation process of the TSV 30) after the conductive protective film 12 is formed.

From the above, in the present embodiment, it is possible to further decrease the influence of the probe test, and the yield, the reliability, and the like of the semiconductor device 100 is able to be improved further.

<2. Second Embodiment>

While an example in which a thick conductive protective film 12 (metallic film) is formed on the metal pad 11 (metal wiring) was described in the first embodiment described above, the embodiments of the present disclosure are not limited thereto. For example, the metal wiring may be configured by a multi-layered film composed of a plurality of metallic layers, and the metallic layer that is positioned furthest to one surface side of the multi-layered film may be used as the conductive protective film. In the second embodiment, such an example will be described.

[Configuration of Semiconductor Device]

Figure 11:
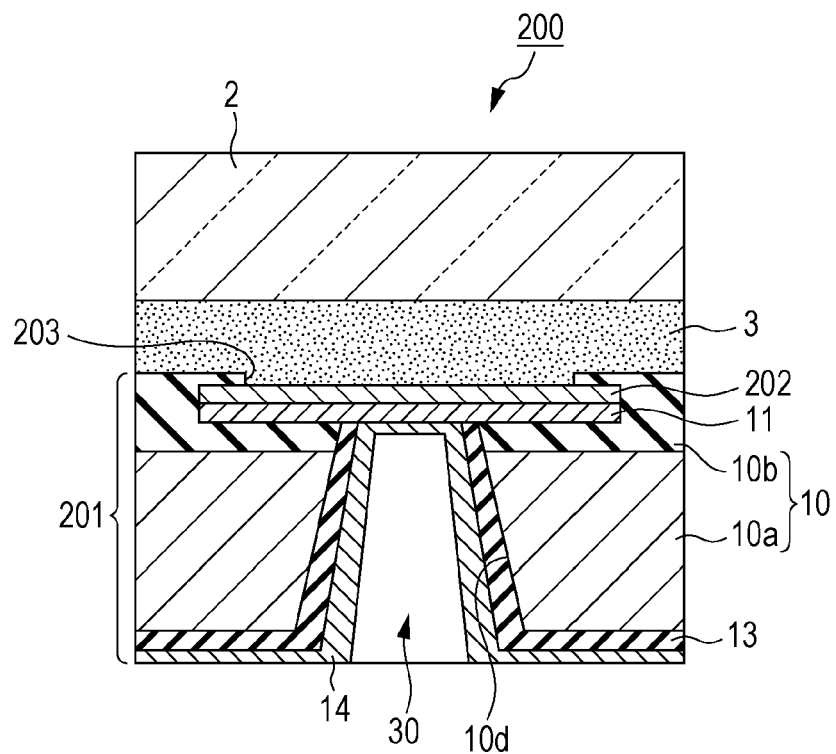
FIG. 11 is a schematic cross-sectional diagram of a semiconductor device according to a second embodiment of the present disclosure.

A schematic cross-sectional diagram of a semiconductor device according to a second embodiment is illustrated in FIG. 11. Here, in the present embodiment, similarly to the first embodiment described above, description will be given using a solid-state imaging element (image sensor) as an example of the semiconductor device. Further, in order simplify description, only the configuration of the semiconductor device of the present embodiment in the vicinity of the TSV is illustrated in FIG. 11. Furthermore, the same reference symbols are given to configurations of a semiconductor device 200 of the present embodiment illustrated in FIG. 11 which are similar to the semiconductor device 100 of the first embodiment illustrated in FIG. 1.

The semiconductor device 200 of the present embodiment illustrates a device main body portion 201, the glass substrate 2, and the glass sealing material 3. Here, although not shown in FIG. 11, similarly to the first embodiment described above, the semiconductor device 200 includes a plating film, a solder mask, and a solder ball. Further, the glass substrate 2 and the glass sealing material 3 of the semiconductor device 200 of the present embodiment have the same configurations as those in the first embodiment described above. That is, in the present embodiment, since configurations other than the device main body portion 201 are the same as corresponding configurations of the first embodiment described above, here, only the configuration of the device main body portion 201 will be described.

[Overall Configuration of Device Main Body Portion]

The device main body portion 201 includes the Si base material portion 10 (base material portion), the metal pad 11 (metallic film), a conductive protective film 202, the insulating layer 13, and the metal seed layer 14 (vertical hole electrode). Further, although not shown in FIG. 11, similarly to the first embodiment, the device main body portion 201 includes a sensor unit that includes photodiodes and on-chip micro lenses.

With the semiconductor device 200 of the present embodiment, as illustrated in FIG. 11, the metal pad 11 is formed on an upper portion (glass substrate 2 side) of the TSV 30 (vertical hole wiring portion) and furthermore, a thin conductive protective film 202 is laminated on the metal pad 11. That is, in the embodiment, the metal wiring has a two-layered structure with the metal pad 11 and the conductive protective film 202.

Furthermore, in the present embodiment, an opening portion 203 is provided on the oxidized layer 10b (insulating film) of the Si base material portion 10, and the conductive protective film 202 is exposed to the opening portion 203. In the present embodiment, the probe test is performed by bringing the probe into contact with the conductive protective film 202 that is exposed to the opening portion 203.

Here, since the conductive protective film 202 is formed following the formation process of the metal pad 11, the conductive protective film 202 is formed by the same technique of forming the metal pad 11 (for example, a sputtering method). Therefore, as with the first embodiment, it is difficult to form a thick (approximately equal to or greater than several tens of μm) conductive protective film 202. Therefore, in the embodiment, the conductive protective film 202 is formed with a conductive material with a relatively high hardness so that damage is not caused on the metal pad 11 when the probe is brought into contact with the conductive protective film 202. For example, the conductive protective film 202 is able to be formed by a material such as, for example, W, Ti, or Ta.

Further, although an example in which the conductive protective film 202 is configured as a single layer is described in the example illustrated in FIG. 11, the embodiments of the present disclosure are not limited thereto. For example, the conductive protective film 202 may have a multi-layered structure. More specifically, the conductive protective film 202 is able to be configured by a laminated film of a TiN film and a Ti film, a TaN film and a Ta film, and the like.

In the present embodiment, configurations other than making the metal wiring a multi-layered structure as described above are similar to corresponding configurations of the first embodiment described above.

[Technique of Manufacturing Semiconductor Device]

Next, an example of a technique of creating the semiconductor device 200 of the present embodiment will be described with reference to FIGS. 12 to 15. Here, since with the technique of creating the semiconductor device 200 of the present embodiment, the processes up to the probe test are the same as those of the semiconductor device 100 of the first embodiment described above, cross-sectional diagrams of the semiconductor members that are created in each process up to the probe test are illustrated in FIGS. 12 to 15. Further, here, in order to simplify description, the creation process of the configuration of the device main body portion 201 in the vicinity of the TSV 30 will be described. Other configuration portions are able to be created similarly to the technique of creating the solid-state imaging element of the related art, for example.

Figure 12:
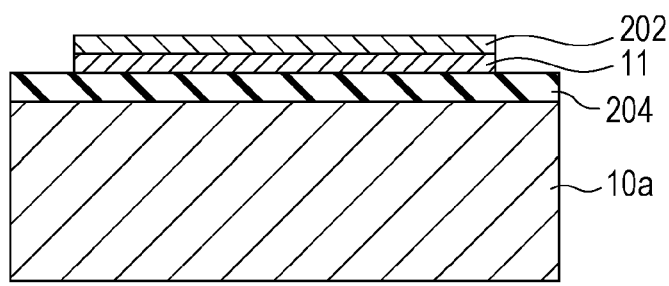
FIG. 12 is a diagram for illustrating the manufacturing process of the semiconductor according to the second embodiment.

In the present embodiment, first, the oxidized film 204 is formed on the Si layer 10a using a technique such as, for example, a plasma CVD method. Next, as illustrated in FIG. 12, the metal pad 11 and the conductive protective film 202 are formed in such an order on the oxidized film 204.

Here, although the formation technique of the metal pad 11 and the conductive protective film 202 is arbitrary, for example, the metal pad 11 and the conductive protective film 202 is able to be formed as below. First, a first metallic film that is composed of the formation material of the metal pad 11 and a second metallic film that is composed of the formation material of the conductive protective film 202 are formed on the oxidized film 204 using a technique such as, for example, a sputtering method. Next, the metal pad 11 and the conductive protective film 202 are formed by patterning a laminated film that is composed of the first metallic film and the second film.

However, taking into consideration the process margin of the opening portion 203 described later that is formed on the conductive protective film 202, a metal pad 11 and a conductive protective film 202 with a slight larger size than is characteristically important are formed in the formation process of the metal pad 11 and the conductive protective film 202.

Figure 13:
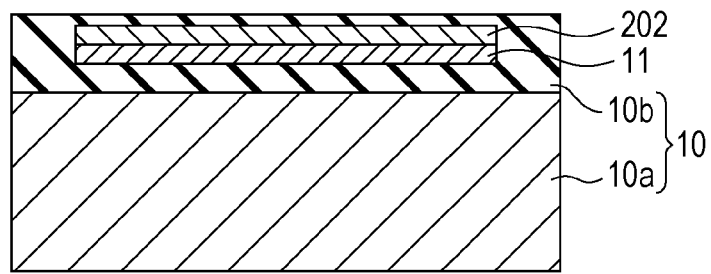
FIG. 13 is another diagram for illustrating the manufacturing process of the semiconductor according to the second embodiment.

Next, as illustrated in FIG. 13, the oxidized layer 10b of the Si base material portion 10 is created by forming an oxidized film on the conductive protective film 202 using a technique such as, for example, a plasma CVD method.

Figure 14:
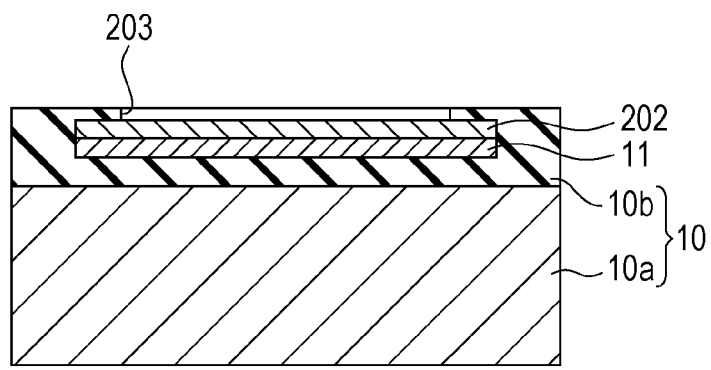
FIG. 14 is another diagram for illustrating the manufacturing process of the semiconductor according to the second embodiment.

Next, a portion of the region of the oxidized layer 10b on the conductive protective film 202, specifically, a region that includes the contact region of the probe is removed by etching. In so doing, as illustrated in FIG. 14, the opening portion 203 is formed on the region of the oxidized layer 10b which includes the contact region of the probe, and the conductive protective film 202 is exposed to the opening portion 203. Here, in the present embodiment, as described above, taking into consideration the process margin of the opening portion 203, a conductive protective film 202 with a slightly larger size that is characteristically important is formed. Therefore, the opening area of the opening portion 203 becomes smaller than the area of the conductive protective film 202, and the region of the conductive protective film 202 in the vicinity of the outer circumference end portion becomes a state of being covered by the oxidized layer 10b.

Figure 15:
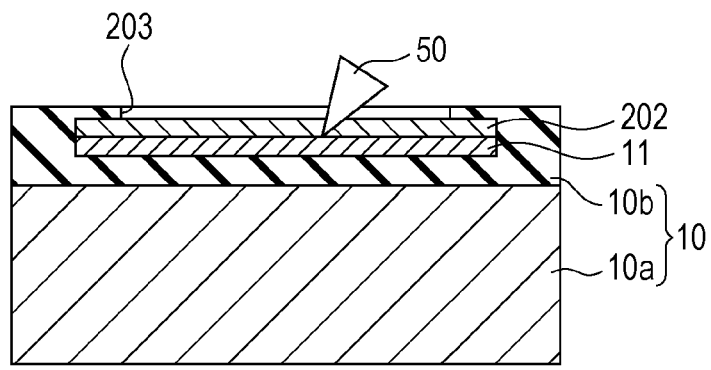
FIG. 15 is another diagram for illustrating the manufacturing process of the semiconductor according to the second embodiment.

Next, a probe test is performed on the semiconductor member that is created by the process described above. Specifically, as illustrated in FIG. 15, the electrical performance of the semiconductor member is evaluated by bringing the probe 50 into contact with the metal pad 11 via the conductive protective film 202. Here, at such a time, since the metal pad 11 is protected by the conductive protective film 202 with high hardness, damage to the metal head 11 is able to be reduced.

After the probe test described above has ended, the semiconductor device 200 is created similarly to the first embodiment described above (creation process described in FIGS. 6 to 10).

As described above, the semiconductor device 200 of the present embodiment has a configuration in which the metal pad 11 is protected by the conductive protective film 202 with high hardness during the probe test, and the metal pad 11 is lined by the conductive protective film 202 in a region that includes the contact region with the probe. Therefore, the same effects as the first embodiment described above are obtained with the present embodiment.

Further, in the present embodiment, since it is possible to form the conductive protective film 202 by the same process as the metal pad 11, the semiconductor device 200 is able to be created more easily. Here, in the present embodiment, as described above, since it is difficult to make the film thickness of the conductive protective film 202 thick, the configuration of the first embodiment described above has an advantage over the present embodiment in that a thick conductive protective film is important.

<3. Various Modifications and Applications>

Next, various modifications and applications of the semiconductor devices of the first and second embodiments will be described.

[Modification 1]

Although examples in which the conductive protective film is formed on the surface of the metal pad 11 (metal wiring) on the probe contact side have been shown in the first and second embodiments, the embodiments of the present disclosure are not limited thereto, and the conductive protective film may be formed on the surface of the metal pad 11 on the opposite side to the probe contact side. Modification 1 describes such a configuration example.

Figure 16:
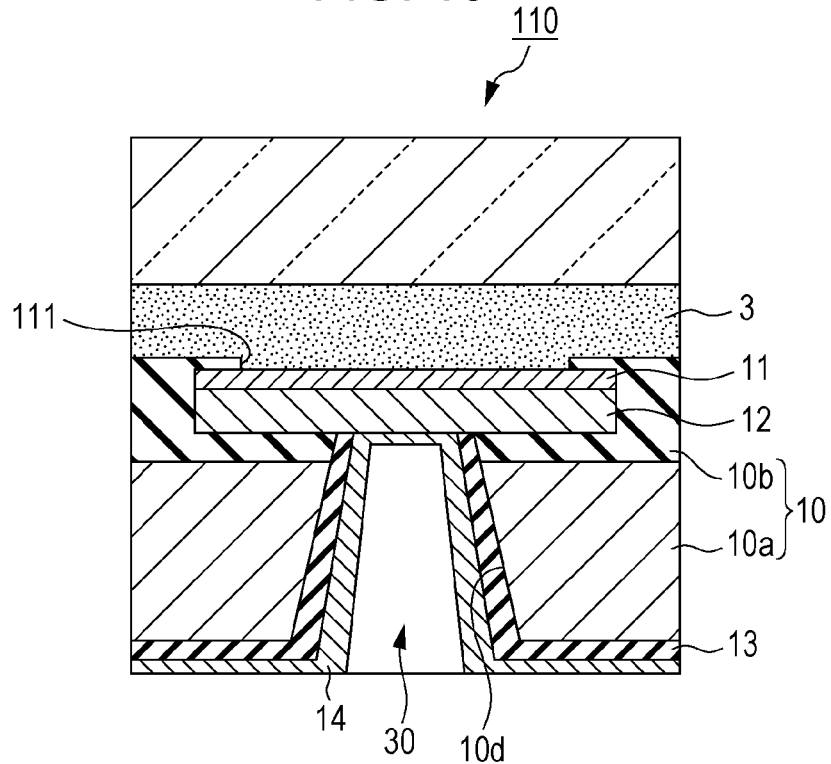
FIG. 16 is a schematic cross-sectional diagram of a semiconductor device of Modification 1 (Modification 1-1)
Figure 17:
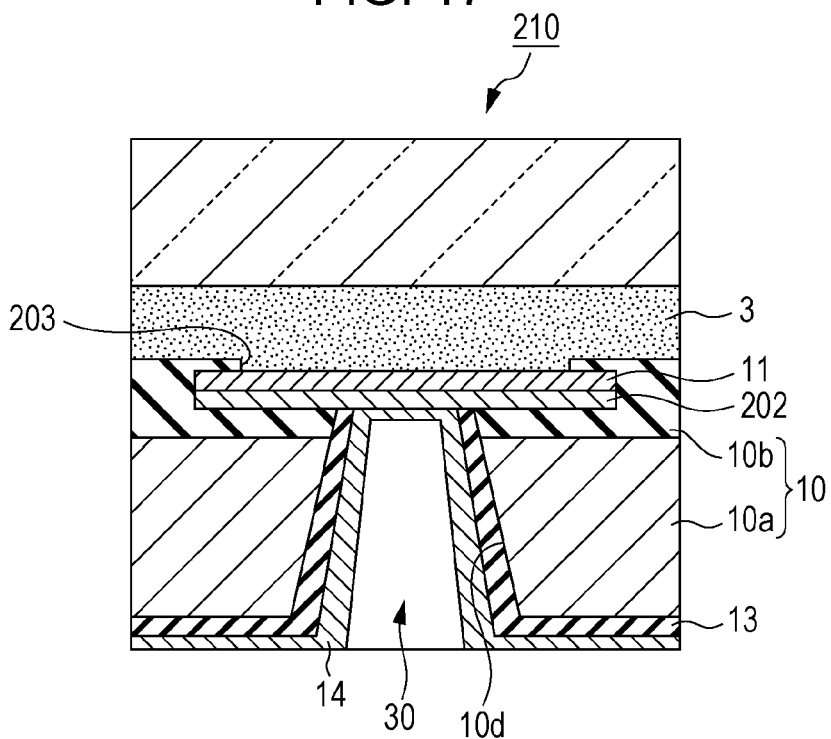
FIG. 17 is a schematic cross-sectional diagram of a semiconductor device of Modification 1 (Modification 1-2)

Schematic diagrams of a semiconductor device of Modification 1 are illustrated in FIGS. 16 and 17. FIG. 16 is a schematic cross-sectional diagram of a semiconductor device 110 (Modification 1-1) in a case when the configuration of Modification 1 is applied to the semiconductor device 100 of the first embodiment. Further, FIG. 17 is a schematic cross-sectional diagram of a semiconductor device 210 (Modification 1-2) in a case when the configuration of Modification 1 is applied to the semiconductor device 200 of the second embodiment.

Here, in order to simplify description, only the configurations of the semiconductor devices in the vicinity of the TSV 30 are illustrated in FIGS. 16 and 17. Further, with the semiconductor device 110 of Modification 1-1 illustrated in FIG. 16, the same reference symbols are given to configurations that are similar to the semiconductor device 100 of the first embodiment illustrated in FIG. 1. Furthermore, with the semiconductor device 210 of Modification 1-2 illustrated in FIG. 17, the same reference symbols are given to configurations that are similar to the semiconductor device 200 of the second embodiment illustrated in FIG. 11.

As is clear from a comparison between FIGS. 16 and 1, the semiconductor device 110 of Modification 1-1 has a configuration in which the placements of the metal pad 11 and the conductive protective film 12 are the opposite as in the semiconductor device 100 of the first embodiment. Further, with the semiconductor device 110 of Modification 1-1, an opening portion 111 is provided on a region of the oxidized layer 10b on the metal pad 11 which includes the contact region of the probe. According to the semiconductor device 110 of Modification 1-1, configurations other than the configurations described above are the same as the corresponding configurations of the semiconductor device 100 of the first embodiment.

Further, as is clear from a comparison between FIGS. 17 and 11, the semiconductor device 210 of Modification 1-2 has a configuration in which the placements of the metal pad 11 and the conductive protective film 202 are the opposite as in the semiconductor device 200 of the second embodiment. Furthermore, other configurations of the semiconductor device 210 of Modification 1-2 are the same as the corresponding configurations of the semiconductor device 200 of the second embodiment.

With the semiconductor devices of such examples, since the probe comes into direct contact with the metal pad 11 during the probe test, damage is caused to the metal pad 11. However, since a conductive protective film is provided to be in contact with the lower portion of the metal pad 11 in such examples, the conductivity of the metal wiring is maintained, and the influence of the damage on the metal pad 11 is able to be decreased. Further, since a conductive protective film is provided to be in contact with the lower portion of the metal pad 11 in such examples, when the probe is made to come into contact with the metal pad 11, damage is not caused to the oxidized layer 10b of the Si base material portion 10. Furthermore, since such examples are also configurations in which the metal pad 11 is lined by the conductive protective film, the strength of the metal pad 11 is able to be increased. That is, even with such examples, the same effects as the first and second embodiments described above are obtained.

[Modification 2]

Figure 18:
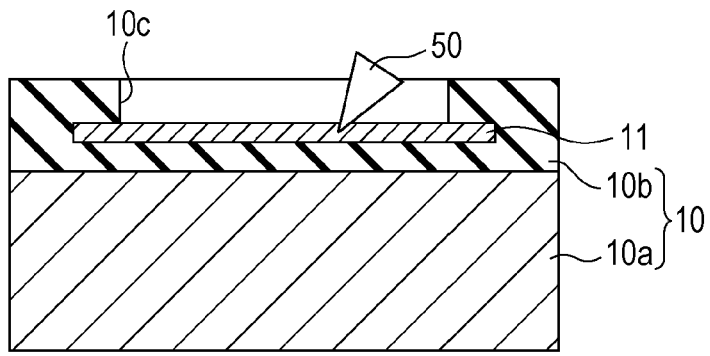
FIG. 18 is a diagram for illustrating the manufacturing process of a semiconductor device of Modification 2.

Although with the first embodiment described above, an example in which a probe test (process of FIG. 5) is performed after forming the conductive protective film 12 on the metal pad 11 (process of FIG. 4) has been described, the embodiments of the present disclosure are not limited thereto. For example, the probe test may be performed before forming the conductive protective film 12 on the metal pad 11. An example of a technique of creating such a semiconductor device (Modification 2) will be described with reference to FIGS. 18 and 19. Here, FIGS. 18 and 19 are diagrams that respectively illustrate the state of processes during the probe test and during the formation of the conductive protective film.

In such an example, first, similarly to the first embodiment, the metal pad 11 is exposed by forming the opening portion 10c of the oxidized layer 10b on the metal pad 11 (processes of FIGS. 2 and 3). Next, as illustrated in FIG. 18, the probe test is performed by causing the probe 50 to come into contact with the metal pad 11 that is exposed to the opening 10c.

Figure 19:
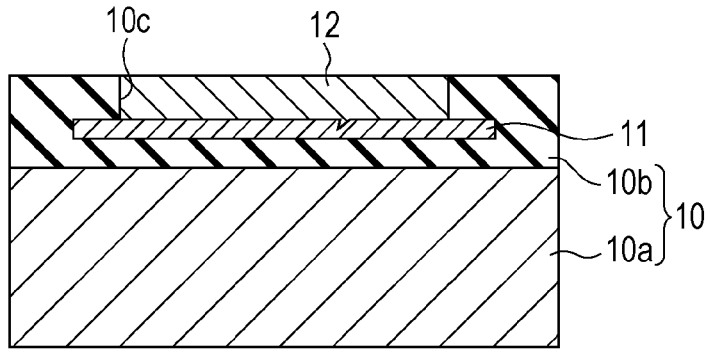
FIG. 19 is another diagram for illustrating the manufacturing process of the semiconductor device of Modification 2.

Next, after the probe test, as illustrated in FIG. 19, the conductive protective film 12 is formed on the metal pad 11 that is exposed to the opening portion 10c of the oxidized layer 10b using a technique such as, for example, a non-electrolytic plating method, a screen printing method, a spray coating method, or a stud bump formation method. Thereafter, the semiconductor is created similarly to the first embodiment described above (processes of FIGS. 6 to 10).

With such an example, since the probe test is performed by bringing the probe into direct contact with the metal pad 11, damage (probe marks) is caused to the metal pad 11. However, in such an example, the conductive protective film 12 is provided to be in contact with the metal pad 11 to cover the metal pad 11 (probe marks) after the probe test. That is, the surface of the metal pad 11 on which the probe marks remain is protected by the conductive protective film 12. In such a case, the conductivity of the metal wiring is maintained, the infiltration of chemicals (for example, a plating solution or the like) that are used in the formation process of the TSV 30 into the probe marks is able to be prevented, and the influence of the damage to the metal pad 11 is able to be decreased.

Furthermore, since such an example also has a configuration in which the metal pad 11 is lined by the conductive protective film 12, the strength of the metal pad 11 is able to be increased. That is, even in such a case, similarly to the first embodiment described above, the influence of the probe test is able to be decreased further, and the yield, the reliability, and the like of the semiconductor device is able to be improved further.

[Modification 3]

In the first embodiment described above, an example in which the conductive protective film 12 (region that includes the probe contact region) is provided on the upper portion of the TSV 30, that is, an example in which the conductive protective film 12 is placed at a position that opposes the opening portion of the vertical hole 10d has been described. However, the embodiments of the present disclosure are not limited thereto. In order to prevent the formation region of the TSV 30 and the formation region of the conductive protective film 12 from overlapping, both regions may be placed within the plane of the Si base material portion 10 of the semiconductor device. One configuration example thereof will be described in Modification 3.

Figure 20:
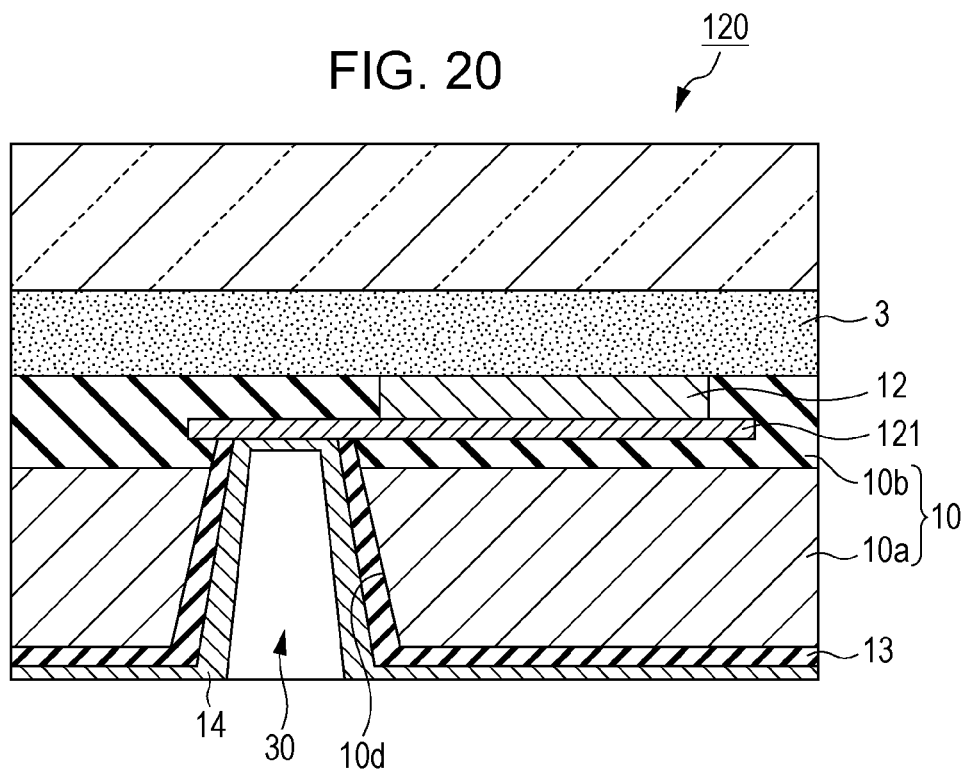
FIG. 20 is a schematic cross-sectional diagram of a semiconductor device of Modification 3.

A schematic diagram of a semiconductor device 120 of Modification 3 is illustrated in FIG. 20. FIG. 20 is a schematic cross-sectional diagram of the semiconductor device 120 in a case when the configuration of Modification 3 is applied to the semiconductor device 100 of the first embodiment, and here, in order to simplify description, only the configuration of the semiconductor device 120 in the vicinity of the TSV 30 is illustrated. Further, with the semiconductor device 120 of Modification 3 illustrated in FIG. 20, the same reference symbols are given to configurations that are the same as the semiconductor device 100 of the first embodiment illustrated in FIG. 1.

As is clear from a comparison between FIGS. 20 and 1, with the semiconductor device 120 of such an example, the formation region of the TSV 30 and the formation region of the conductive protective film 12 are placed to avoid overlapping within the plane of the Si base material portion 10. Furthermore, in such an example, a metal pad 121 is formed in a region that crosses from the formation region of the TSV 30 to the formation region of the conductive protective film 12 within the plane of the Si base material portion 10. With the semiconductor device 120 of such an example, configurations other than the configurations described above are the same as the corresponding configurations of the semiconductor device 100 of the first embodiment.

As described above, even the configuration of such an example is a configuration in which the conductive protective film 12 is formed to be in contact with the metal pad 121 in the contact region of the probe and the metal pad 121 is lined by the conductive protective film 12. Therefore, even with the semiconductor device 120 of such an example, the same effects as the first embodiment described above are obtained.

Here, although an example in which the configuration of Modification 3 is applied to the semiconductor device 100 of the first embodiment was described in the example illustrated in FIG. 20, the embodiments of the present disclosure are not limited thereto, and for example, the configuration of Modification 3 may be applied to the semiconductor device 200 of the second embodiment. That is, the formation region of the TSV 30 and the formation region of conductive protective film 202 may be placed so as to not overlap within the plane of the Si base material portion 10 of the semiconductor device 200 of the second embodiment.

However, in such an example, since the formation region of the TSV 30 and the formation region of the conductive protective film are formed on different regions from each other within the plane of the Si base material portion 10, there may be a case when the chip size of the semiconductor device becomes large compared to those of the semiconductor devices of the first and second embodiments. Therefore, from the viewpoint of miniaturizing the semiconductor device, the semiconductor devices of the first and second embodiments have an advantage over the semiconductor device of such an example.

[Modification 4]

While in the second embodiment described above, the conductive protective film 202 with relatively high hardness which is composed of a material such as, for example, W, Ti, or Ta is formed on the metal pad 11, the stresses on the conductive protective film 202 that is formed by such a material are great. Therefore, if the formation region of the conductive protective film 202 on the metal pad 11 is large, there is a possibility that film peeling of the conductive protective film 202 occurs due to the stresses on the film. Therefore, it is preferable that the formation region of the conductive protective film 202 on the metal pad 11 be as small as possible. Such an example will be described in Modification 4.

Figure 21A:
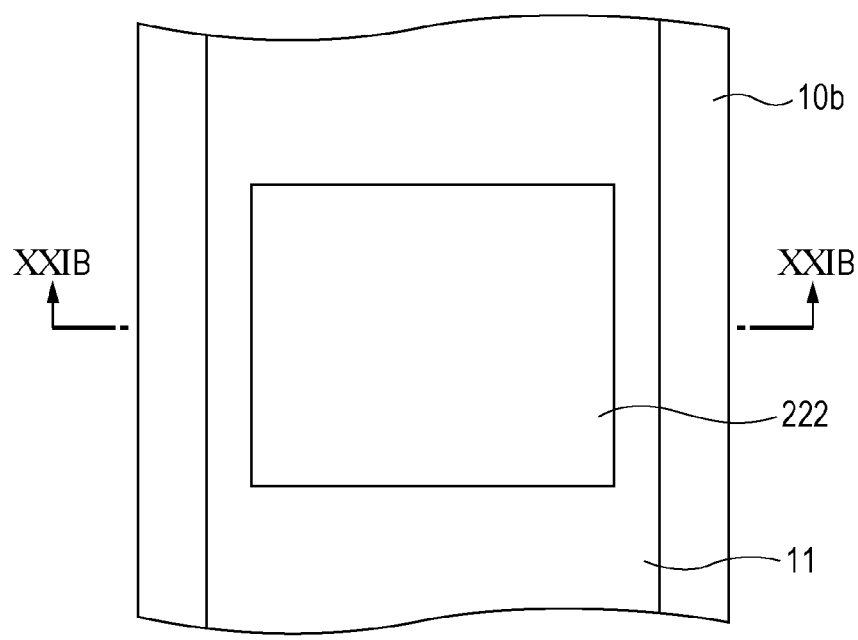
FIGS. 21A and 21B are schematic diagrams of a semiconductor device of Modification 4.
Figure 21B:
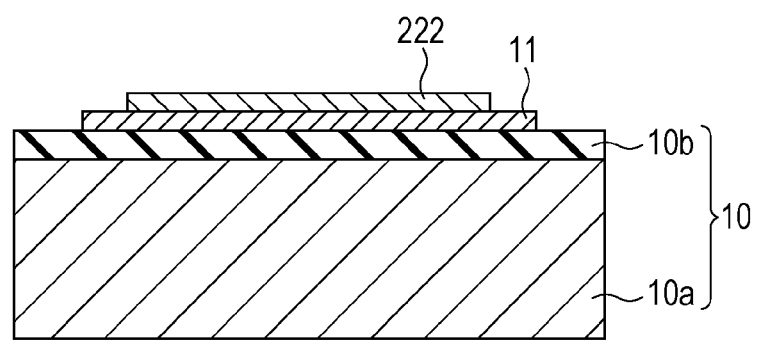

Schematic diagrams of the metal pad 11 and a conductive protective film 222 of the semiconductor device of Modification 4 are illustrated in FIGS. 21A and 21B. Here, FIG. 21A is a plan view of the metal pad 11 and the conductive protective film 222 of the semiconductor device of Modification 4, and FIG. 21B is an I-I cross-sectional view of FIG. 21A. Further, the same reference symbols are given to configurations of the semiconductor device of Modification 4 illustrated in FIGS. 21A and 21B which are similar to the semiconductor 200 of the second embodiment illustrated in FIG. 11. Furthermore, here, in order to simplify description, schematic diagrams of the semiconductor members after the formation process of the conductive protective film 222 are illustrated in FIGS. 21A and 21B.

With the semiconductor device of such an example, the formation region of the conductive protective film 222 is made smaller than the formation region of the conductive protective film 202 of the second embodiment described above illustrated in FIG. 11. For example, the size of the formation region of the conductive protective film 222 is set to the minimum size of the probe pad which is used during the probe test. Here, although not shown in FIGS. 21A and 21B, configurations other than the conductive protective film 222 in the semiconductor device of such an example are the same as the corresponding configurations of the second embodiment described above.

As described above, the configuration of such an example is also a configuration in which the conductive protective 222 is formed to be in contact with the metal pad 11 in a region that includes the contact region of the probe, and the metal pad 11 is lined by the conductive protect film 222. Therefore, the same effects as the second embodiment described above area also obtained with the semiconductor device of such an example. Furthermore, with such an example, since it is possible to make the formation region of the conductive protective film 222 with relatively high hardness still smaller, it is possible to suppress the occurrence of film peeling of the conductive protective film 222 described above.

[Modification 5]

While an example in which the formation region of the conductive protective film 222 is made small in order to suppress film peeling of the conductive protective film 222 was described in Modification 4 described above, the technique of suppressing the occurrence of film peeling of the conductive protective film 222 is not limited to such a technique.

For example, the conductive protective film 222 may be configured by a conductive protective film main body that is composed of a material such as W, Ti, or Ta, and an adhesion layer that is provided on the surface of the conductive protective film main body on the metal pad 11 side. In such a case, since the adhesion layer is formed between the conductive protective film main body that is composed of a material such as W, Ti, or Ta and the metal pad 11, the occurrence of film peeling of the conductive protective film 222 is able to be suppressed.

[Modification 6]

While configuration examples in which the vertical hole 10*d* of the TSV 30 does not penetrate the metal pad 11 have been described in the various embodiments described above, the embodiments of the present disclosure are not limited thereto, and the vertical hole 10*d* may penetrate the metal pad 11. Such a configuration is able to be realized by forming the vertical hole 10*d* using a laser, for example.

[Applications]

The semiconductor device of the various embodiments and modifications described above are able to be applied to various electronic apparatuses. For example, the various embodiments and modifications described able are able to be applied to electronic apparatuses such as, for example, a camera system such as a digital camera or a video camera, a mobile phone that includes an imaging function, or other apparatuses that include an imaging function. Further, the technique of the embodiments of the present disclosure described in the various embodiments and modifications are also able to be applied to MEMSs (Micro Electro Mechanical Systems).

Figure 22:
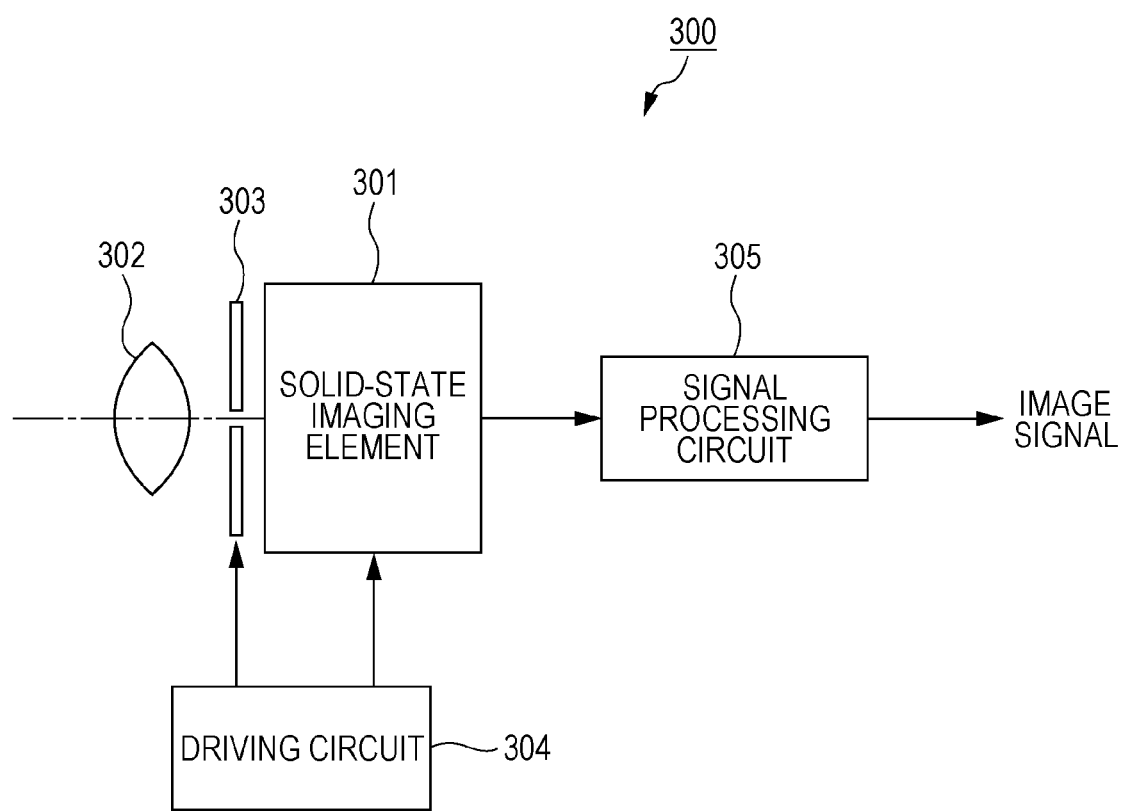
FIG. 22 is a schematic diagram of a camera to which the semiconductor device according to the embodiments of the present disclosure is applied.

Here, description will be given with a camera as an example (application) of an electronic apparatus to which the semiconductor devices of the various embodiments and modifications are applied. A schematic diagram of a camera according to the application is illustrated in FIG. 22. Here, a configuration example of a video camera that is able to capture a still image or a moving image is illustrated in FIG. 22.

A camera 300 in such an example includes a solid-state imaging element 301, an optical system 302 that leads incident light to a light receiving sensor (not shown) of the solid-state imaging element 301, a shutter device 303 that is provided between the solid-state imaging element 301 and the optical system 302, and a driving circuit 304 that drives the solid-state imaging element 301. Furthermore, the camera 300 includes a signal processing circuit 305 that processes output signals of the solid-state imaging element 301.

The solid-state imaging element 301 is configured by any semiconductor device of the various embodiments and modifications described above. The configuration and function of each of the other portions are as below.

The optical system (optical lens) 302 images the image light (incident light) from the subject on an imaging plane (not shown) of the solid-state imaging element 301. In so doing, a signal charge accumulates within the solid-state imaging element 301 for a predetermined period. Here, the optical system 302 may be configured by an optical lens group that includes a plurality of optical lenses. Further, the shutter device 303 controls the light irradiation period and the light blocking period of the incident light to the solid-state imaging element 301.

The driving circuit 304 supplies a driving signal to the solid-state imaging element 301 and the shutter device 303. Furthermore, the driving circuit 304 controls the signal output action to the signal processing circuit 305 of the solid-state imaging element 301 and the shutter action of the shutter device 303 by the supplied driving signal. That is, in such an example, a signal transfer action from the solid-state imaging element 301 to the signal processing circuit 305 is performed by the driving signal (timing signal) that is supplied from the driving circuit 304.

The signal processing circuit 305 performs various types of signal processing on the signal that is transferred from the solid-state imaging element 301. Furthermore, the signal (image signal) on which various types of signal processing have been performed is stored in a storage medium (not shown) such as a memory, or output to a monitor (not shown).

Here, the embodiments of the present disclosure are also able to take the following configuration.

(1)

A semiconductor device including:

a base material portion that includes a semiconductor substrate and an insulating film that is formed on one face of the semiconductor substrate and on which a vertical hole is formed along the thickness direction of the semiconductor substrate;

a vertical hole wiring portion that includes a vertical hole electrode formed on a side wall of the base material portion that forms the vertical hole;

a metallic film that is formed within the insulating film and that is electrically connected to the vertical hole wiring portion; and a conductive protective film that is formed to be in contact with the metallic film within the insulating film and that is formed in a region that includes a contact region of a probe during a probe test that is performed in the middle of manufacture on the film face of the metallic film.

(2)

The semiconductor device according to (1), wherein the metallic film is provided on a semiconductor substrate side of the conductive protective film.

(3)

The semiconductor device according to (1), wherein the conductive protective film is provided on a semiconductor substrate side of the metallic film.

(4)

The semiconductor device according to any one of (1) to (3), wherein the conductive protective film is arranged at a position that opposes an opening portion of the vertical hole.

(5)

The semiconductor device according to any one of (1) to (4), wherein an opening portion with a smaller opening area than a region that includes a contact region of the probe in which the conductive protective film is formed is formed on a surface of the insulating film on the contact side of the probe.

(6)

The semiconductor device according to any one of (1) to (5), wherein the conductive protective film is any one of an Au film, an Ni film, and a Cu film.

(7)

The semiconductor device according to any one of (1) to (5), wherein the conductive protective film is at least one of a W film, a Ti film, a laminated film of a TiN film and a Ti film, and a laminated film of a TaN film and a Ta film.

(8)

A method of manufacturing a semiconductor device including:

forming a semiconductor substrate and a metallic film inside an insulating film of a base material portion that includes the insulating film which is formed on one face of the semiconductor substrate;

forming a conductive protective film to be in contact with the metallic film within a predetermined region that is within the insulating film and within the film face of the metallic film;

performing a probe test by causing the probe in contact with one of the metallic film and the conductive protective film which is exposed on a surface of the insulating film which is the opposite side to the semiconductor substrate side; and forming a vertical hole on the base material portion along the thickness direction of the semiconductor substrate after the probe test.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:

a base material portion that includes a semiconductor substrate and an insulating film that is formed on one face of the semiconductor substrate and on which a hole is formed along a thickness direction of the semiconductor substrate;

a hole wiring portion that includes a hole electrode formed on a side wall of the base material portion that forms the hole;

a metallic film that is formed within the insulating film and that is electrically connected to the hole wiring portion;

a conductive protective film that is arranged at a position that opposes an opening portion of the hole and formed to be in physical contact with the metallic film within the insulating film, wherein the conductive protective film is provided on the semiconductor substrate side of the metallic film; and wherein a region of the metallic film in the vicinity of the outer circumference end portion is covered by the insulating film.

2. The semiconductor device according to claim 1, wherein an opening area of an opening portion of the insulating film is smaller than the area of the metallic film.

3. The semiconductor device according to claim 1, wherein the conductive protective film is arranged at a position that opposes an opening portion of the hole.

4. The semiconductor device according to claim 1, wherein the conductive protective film comprises any one of an Au film, an Ni film, and a Cu film.

5. The semiconductor device according to claim 1, wherein the conductive protective film comprises at least one of a W film, a Ti film, a laminated film of a TiN film and a Ti film, and a laminated film of a TaN film and a Ta film.

6. A semiconductor device comprising:
a base material portion that includes a semiconductor substrate and an insulating film that is formed on one face of the semiconductor substrate and on which a hole is formed along a thickness direction of the semiconductor substrate;
a hole wiring portion that includes a hole electrode formed on a side wall of the base material portion that forms the hole;
a metallic film that is formed within the insulating film and that is electrically connected to the hole wiring portion;
a conductive protective film that is arranged at a position that opposes an opening portion of the hole and formed to be in physical contact with the metallic film within the insulating film,
wherein the metallic film is provided on the semiconductor substrate side of the conductive protective film; and
wherein a region of the conductive protective film in the vicinity of the outer circumference end portion is covered by the insulating film.

7. The semiconductor device according to claim 6,
wherein an opening area of an opening portion of the insulating film is smaller than the area of the conductive protective film.

8. The semiconductor device according to claim 6,
wherein the conductive protective film is arranged at a position that opposes an opening portion of the hole.

9. The semiconductor device according to claim 6, wherein the conductive protective film comprises any one of an Au film, an Ni film, and a Cu film.

10. The semiconductor device according to claim 6, wherein the conductive protective film comprises at least one of a W film, a Ti film, a laminated film of a TiN film and a Ti film, and a laminated film of a TaN film and a Ta film.

* * * * *